US012744062B2

(12) United States Patent
Cai et al.

(10) Patent No.: US 12,744,062 B2

(45) Date of Patent: Sep. 22, 2026

(54) THREE-DIMENSIONAL MEMORY ARRAY AND PREPARATION METHOD THEREOF

(71) Applicant: PEKING UNIVERSITY, Beijing (CN)

(72) Inventors: Yimao Cai, Beijing (CN); Zongwei Wang, Beijing (CN); Gaoqi Yang, Beijing (CN); Shengyu Bao, Beijing (CN); Ru Huang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 113 days.

(21) Appl. No.: 18/966,791

(22) Filed: Dec. 3, 2024

(65) Prior Publication Data

US 2025/0191617 A1 Jun. 12, 2025

(30) Foreign Application Priority Data

Dec. 6, 2023 (CN) ......................... 202311662690.2

(51) Int. Cl.

*G11C 5/06* (2006.01)
*H10B 63/00* (2023.01)
*H10N 70/00* (2023.01)

(52) U.S. Cl.

CPC ............. *G11C 5/063* (2013.01); *H10B 63/30* (2023.02); *H10B 63/84* (2023.02); *H10N 70/023* (2023.02)

(58) Field of Classification Search

CPC ............ G11C 13/0011; G11C 13/0023; G11C 13/004

See application file for complete search history.

(56) References Cited

U.S. PATENT DOCUMENTS

| | | | | |
|---|---|---|---|---|
| 2010/0117047 | A1 * | 5/2010 | Tanaka ................... | H10B 63/20 257/E21.085 |
| 2015/0070965 | A1 * | 3/2015 | Bandyopadhyay .. | H10N 70/823 365/148 |
| 2021/0383864 | A1 | 12/2021 | Jung et al. | |

FOREIGN PATENT DOCUMENTS

| | | | |
|---|---|---|---|
| CN | 102024494 | A | 4/2011 |
| CN | 103871463 | A | 6/2014 |
| CN | 111653666 | A | 9/2020 |
| CN | 113658625 | A | 11/2021 |

* cited by examiner

*Primary Examiner* — Han Yang

(74) *Attorney, Agent, or Firm* — Shih IP Law Group, PLLC

(57) ABSTRACT

The present disclosure provides a three-dimensional memory array and a preparation method thereof, wherein the three-dimensional memory array includes memory cells arranged in an array; wherein in each memory cell: one end of the memory cell is connected to a word line WL, and the other end thereof is connected to a bit line BL; a corresponding gating transistor is arranged at the bottom of each word line WL, and the bottom of the word line WL is connected to the drain of the gating transistor; the gate of the gating transistor is connected to a gate line GL, and the source of the gating transistor is connected to a source line SL; the bit line BL, the word line WL, the source line SL and the gate line GL control the state of the memory cell.

9 Claims, 11 Drawing Sheets

THREE-DIMENSIONAL MEMORY ARRAY AND PREPARATION METHOD THEREOF

TECHNICAL FIELD

The present disclosure relates to the technical field of semiconductor and CMOS hybrid integrating circuits, and more specifically, to a three-dimensional memory array and a preparation method thereof.

BACKGROUND

In recent years, the artificial intelligence market has achieved significant growth. At the same time, with the continuous popularity of smart terminals such as smartphones, watches, and bracelets, the market demand for energy-efficient hardware is also increasing. However, conventional computing architecture is designed based on the von Neumann architecture, which separates the processor and memory, with the processor retrieving data from memory, processing it, and then storing the data back into memory. This process requires a large amount of data transfer between the processor and memory, resulting in increased energy consumption and time delays.

Therefore, in order to realize a large amount of data transmission and calculation between the processor and the memory, the conventional solution is to use new devices such as resistive random access memory (RRAM), phase change memory (PRAM), magneto-resistive memory (MRAM) and ferroelectric memory (FeRAM) to realize data in-memory computing. Among them, resistive random access memory has become one of the most promising candidate devices for new in-memory computing because of its non-volatile characteristics, multi-value storage potential, high integration density and compatibility with existing semiconductor processes.

As a typical memory of the above, RRAM array has a structure in which the vertical connection of each word line and bit line (Crossbar structure), and thus the leakage current has a great impact on the read operation. That is, the interference current from the adjacent cells can cause reading and programming errors. How to access the selected memory cell in the array with anti-interference is one of the main challenges facing high-density memory arrays.

At present, the mainstream storage arrays include 1T1R, 1D1R and 1S1R structures formed by connecting RRAM with transistors, diodes and volatile selectors in series. Among them, as for the 1T1R structure, the transistor is used as a gating unit to turn off the leakage path. However, each memory cell occupies a large area, and the three-terminal MOSFET device undermines the high scalability advantage of RRAM, and is not suitable for three-dimensional stacking. As for the two-terminal 1D1R and 1S1R structures, although the occupied area can be reduced and multi-layer stacking can be performed, it has more application potential for three-dimensional integration. Among them, 1D1R uses the forward conduction and reverse cutoff of the diode to suppress leakage current, but its unlimited current function and unidirectional conduction limitation make it unsuitable for bipolar RRAM, wherein the two-terminal structure of 1S1R is considered to be the most promising integrated structure due to the excellent scalability of the selector, simple structure, and no additional area. However, the material system of the selector is complex and the device performance fluctuates greatly, which increases the read voltage threshold of the memory. In addition, the nonlinearity provided by the selector is limited, and the leakage is still serious in larger-scale arrays, which seriously limits the practical application of the 1S1R array.

SUMMARY

In view of the above problems, the present disclosure provides a three-dimensional memory array and a preparation method to solve the problems of the existing memory array, such as unstable performance, limited nonlinearity, risk of side leakage current, and limitation of practical application of the array.

A three-dimensional memory array according to the present disclosure includes memory cells arranged in an array; wherein in each memory cell: one end of the memory cell is connected to a word line WL, and the other end thereof is connected to a bit line BL, and a corresponding gating transistor is provided at the bottom of each word line WL, and the bottom of the word line WL is connected to a drain of the gating transistor; a gate of the gating transistor is connected to a gate line GL, and a source of the gating transistor is connected to a source line SL; and the bit line BL, the word line WL, the source line SL, and the gate line GL control the state of the memory cell.

In addition, an optional technical solution is that: a drain of the gating transistor is connected to the word line WL; and the word line WL, the bit line BL, and the gate line GL are arranged in directions perpendicular to each other, and the source line SL and the bit line BL are arranged in directions parallel to each other.

In addition, an optional technical solution is that: the memory cell includes a RRAM and a selector connected in series, a self-selection cell (SSC), or a RRAM and a selector connected in series through an embedded intermediate electrode.

On the other hand, the present disclosure may further provide a method of preparing a three-dimensional memory array, including: preparing the three-dimensional memory array by a bit line oxidation method or a bit line filling method.

In addition, an optional technical solution is that: when the memory cell is a RRAM and a selector connected in series, the bit line oxidation method includes: preparing alternately stacked isolation dielectric layers and bit lines on a preset front layer; preparing vertical through holes on the isolation dielectric layer and the bit lines by etching, wherein the vertical through holes penetrate the isolation dielectric layer and the bit lines and extend to the front layer; preparing gating layer by chemical reaction and corrosion treatment in sequence; preparing a resistive switching layer extending through the vertical through holes, wherein the resistive switching layer and the gating layer form a 1S1R memory cell; disposing vertical word lines within the vertical through holes to form the three-dimensional memory array.

In addition, an optional technical solution is that: when the memory cell is a RRAM and a selector connected in series, the bit line filling method includes: preparing an isolation dielectric layer and a sacrificial dielectric layer stacked alternately on a preset front layer; preparing vertical through holes on the isolation dielectric layer and the sacrificial dielectric layer by etching, wherein the vertical through holes penetrate the isolation dielectric layer and the sacrificial dielectric layer and extend to the front layer; corroding an edge of the sacrificial dielectric layer to form a gating groove, and preparing a gating layer in the gating groove; preparing a resistive switching layer extending through the vertical through holes, wherein the resistive switching layer and the gating layer form a 1S1R memory cell; disposing vertical word lines in the vertical through holes; corroding the remaining sacrificial layer dielectric, and filling metal bit lines in the corroded sacrificial layer to form the three-dimensional memory array.

In addition, an optional technical solution is that: the material of the isolation dielectric layer includes silicon oxide $SiO_2$ or carbon silicon oxyhydride (SiCOH); the preparation process of the isolation dielectric layer includes chemical vapor deposition (CVD) or plasma enhanced chemical vapor deposition (PECVD); the thickness of the isolation dielectric layer is in the range of 10 to 1000 nm.

In addition, an optional technical solution is that: the materials of the bit line and the word line include one or more selected from a group consisting of metal vanadium V, metal niobium Nb, metal ruthenium Ru, metal tungsten W, metal tantalum Ta, tantalum nitride TaN, metal titanium Ti, titanium nitride TiN, titanium tungsten TiW, metal aluminum Al, aluminum oxide $AlO_x$, aluminum titanium nitride TiAIN or AlTIN, metal hafnium Hf, metal iridium Ir, metal manganese Mn, metal zinc Zn, metal platinum Pt, metal palladium Pd, metal copper Cu and mixtures thereof; the materials of the bit lines and the word lines are doped with polysilicon material; preparation process for the bit lines and the word lines includes physical vapor deposition (PVD), plasma enhanced chemical vapor deposition or atomic layer deposition; and the thickness of the bit lines is in the range of 10 to 1000 nm.

In addition, an optional technical solution is that: the material of the gating layer includes one or more selected from a group consisting of niobium oxide ($NbO_x$), vanadium oxide ($VO_x$), and mixtures thereof; the preparation process of the gating layer includes: oxidation, atomic layer deposition (ALD), or physical vapor deposition (PVD); or doping the material, wherein the dopant includes one or more selected from a group consisting of Al, Cu, Au, and Ti, and the doping process includes ion implantation (IMP) and co-sputtering; the material of the resistive switching layer includes one or more selected from a group consisting of tantalum, tantalum oxide $TaO_x$, titanium oxide $TiO_x$, hafnium oxide $HfO_x$, zirconium oxide $ZrO_x$, silicon oxide $SiO_x$, etc. and mixtures thereof; the preparation process of the resistive switching layer includes oxidation or atomic layer deposition (ALD); and the resistive switching layer includes dopants, wherein the dopant includes one or more selected from a group consisting of Al, Cu, Au, and Ti, etc., and the doping process includes ion implantation (IMP) and co-sputtering.

In addition, an optional technical solution is that: the material of the sacrificial dielectric layer includes $SiN_x$; and the preparation process of the sacrificial dielectric layer includes oxidation, atomic layer deposition (ALD), or physical vapor deposition (PVD)

The three-dimensional memory array and preparation method can significantly reduce the nonlinear requirements of 1S1R for the selector and increase the storage capacity of the array; and compared with the conventional 1T1R structure, it can reduce the area overhead and increase the density of memory cells. In addition, during the preparation process, RRAM stacking can be fully compatible with CMOS logic process, and can be used as embedded memory or independent memory. And, as the number of stacking layers increases, the process has more cost advantages.

In order to achieve the above and related purposes, one or more aspects of the present disclosure include the features that will be described in detail later. The following description and the drawings describe some exemplary aspects of the present disclosure in detail. However, these aspects indicate only some of the various ways in which the principles of the present disclosure can be used. In addition, the present disclosure is intended to include all these aspects and their equivalents.

BRIEF DESCRIPTION OF DRAWINGS

By referring to the following description in conjunction with the drawings, and with a more comprehensive understanding of the present disclosure, other objects and results of the present disclosure will become clearer and easier to be understood. In the drawings.

Figure 1:
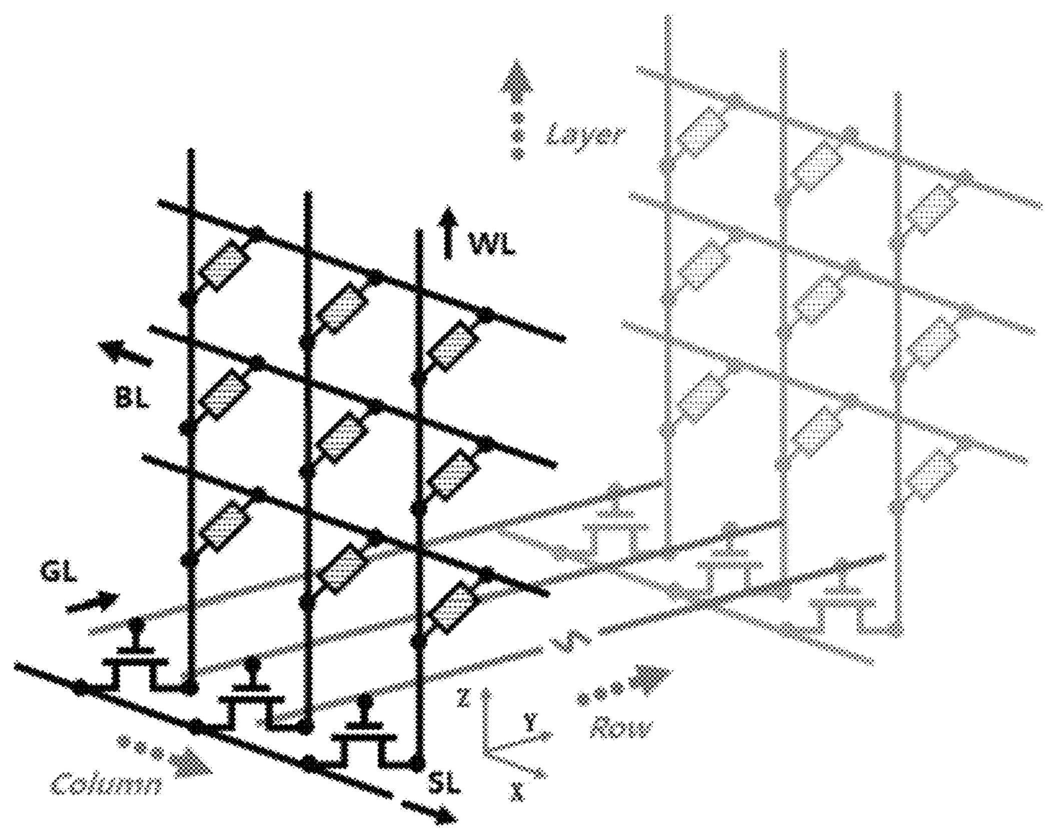
FIG. 1 is a schematic diagram of the architecture of a three-dimensional memory array according to an embodiment of the present disclosure.

The numerals in the drawings: front layer 1, isolation dielectric layer 2, bit line 3, gating layer 4, vertical through hole 5, resistive switching layer 6, word line 7, sacrificial dielectric layer 8, gating groove 9, avoidance space 10, intermediate electrode 11, and self-selection cell 12.

Like reference numerals throughout the drawings indicate like or corresponding features or functions.

DETAILED DESCRIPTIONS

In the following description, for the purpose of illustration, in order to provide a comprehensive understanding of one or more embodiments, many specific details are set forth. However, it is apparent that these embodiments may also be implemented without these specific details. In other examples, for ease of describing one or more embodiments, known structures and devices are shown in the form of block diagrams.

In the description of the present disclosure, it is to be understood that the terms "center", "longitudinal", "lateral", "length", "width", "thickness", "up", "down", "front", "back", "left", "right", "vertical", "horizontal", "top", "bottom", "inside", "outside", "clockwise", "counterclockwise", "axial", "radial", "circumferential", etc., indicating orientations or positional relationships based on the orientations or positional relationships shown in the drawings, are only for the convenience of describing the present disclosure and simplifying the description, and do not indicate or imply that the device or element referred to must have a specific orientation, be constructed and operated in a specific orientation, and therefore should not be understood as limiting the present disclosure.

In order to solve the problems of unstable performance, limited nonlinearity, leakage current, which limit of practical application of arrays according to existing memory schemes, the present disclosure provides a three-dimensional memory array and a preparation method thereof, wherein one end of a memory cell is connected to a word line WL, and the other end thereof is connected to a bit line BL, and the bottom of each word line WL is connected to a source line SL via a gating transistor; the gate of the gating transistor is connected to a gate line GL, and the state of the memory cell is controlled and adjusted through the bit line BL, the word line WL, the source line SL, and the gate line GL, which can greatly reduce the nonlinear requirements of 1S1R for the selector and improve the storage capacity of the array; and compared with the conventional 1T1R structure, it can reduce area overhead and improve the density and performance of the memory cell.

To describe the three-dimensional memory array and the preparation method of the present disclosure in detail, specific embodiments of the present disclosure will be described in detail below with reference to the drawings.

Figure 2:
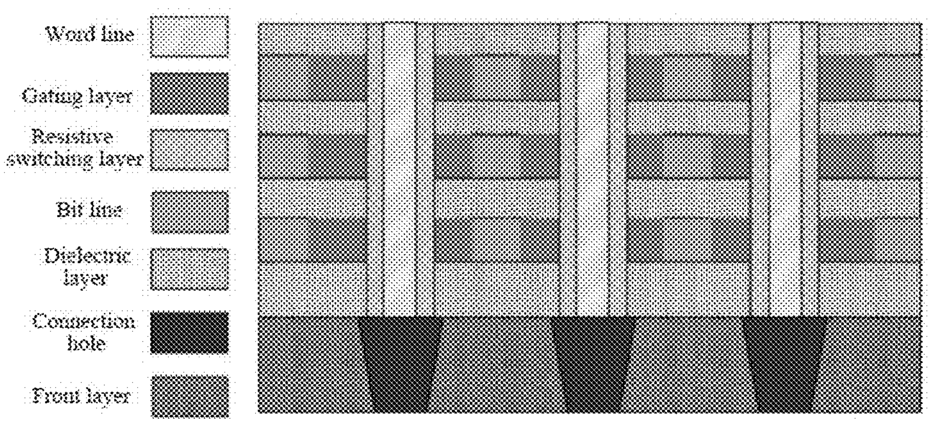
FIG. 2 is a longitudinal cross-sectional view of a three-dimensional memory array according to an embodiment of the present disclosure.
Figure 3:
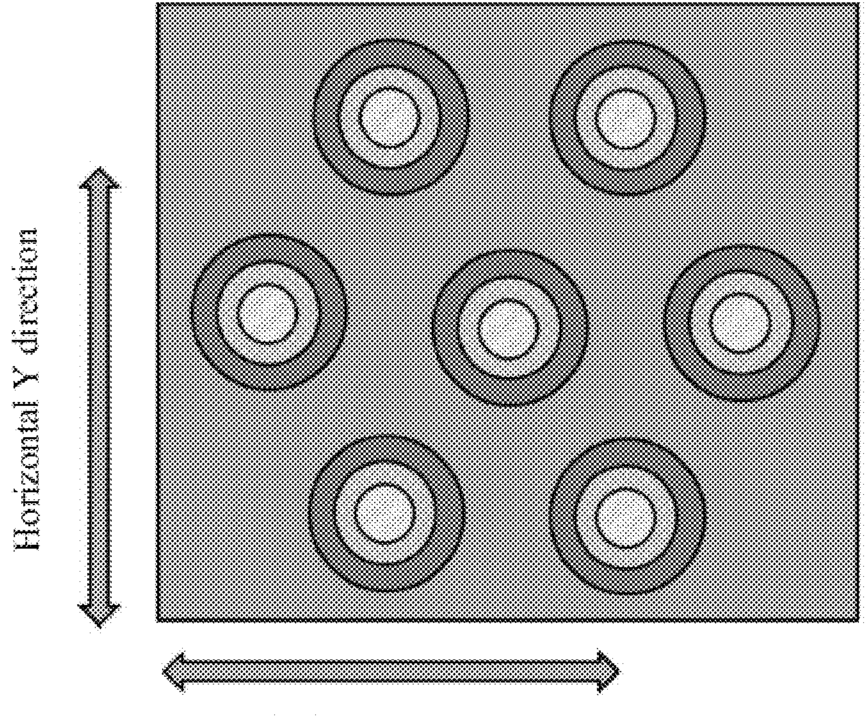
FIG. 3 is a lateral cross-sectional view of a three-dimensional memory array according to an embodiment of the present disclosure.
Figure 4:
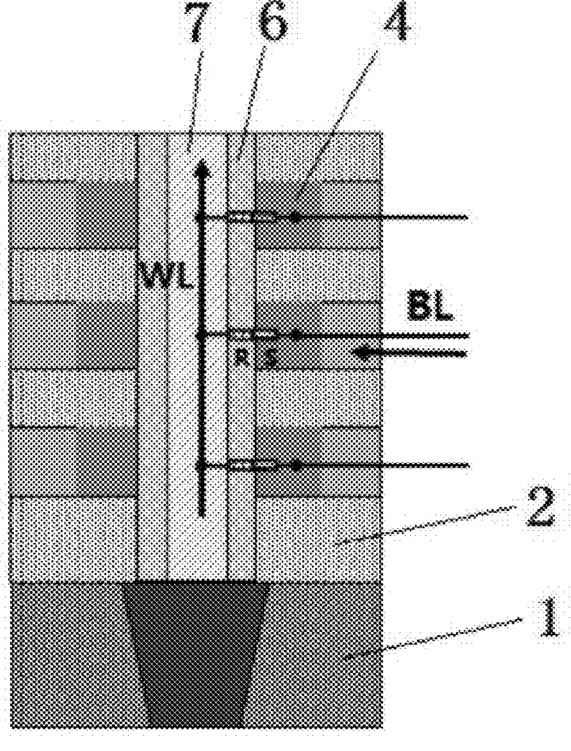
FIG. 4 is a schematic structural diagram of a memory cell of a three-dimensional memory array according to an embodiment of the present disclosure.

FIG. 1 illustrates the architectural principle of a three-dimensional memory array according to an embodiment of the present disclosure. FIGS. 2 and 3 respectively illustrate the cross-sectional structures of the three-dimensional memory array in different directions according to the first embodiment. FIG. 4 illustrates the structural principle of a memory cell of the three-dimensional memory array according to an embodiment of the present disclosure.

As shown in both FIGS. 1 and 4, the three-dimensional memory array of the embodiment of the present disclosure includes a plurality of memory cells arranged in an array, wherein in each memory cell: one end of the memory cell is connected to a word line WL (vertical word line or word line 7, the same below), and the other end thereof is connected to a bit line BL, a corresponding gating transistor is provided at the bottom of each word line WL, and the bottom of the word line WL is connected to the drain of the gating transistor; the gate of the gating transistor is connected to the gate line GL, and the state of the memory cell is controlled and adjusted through the cooperation of the bit line BL, the word line WL, the source line SL and the gate line GL.

The gate of the gating transistor is connected to the gate line GL, the source of the gating transistor is connected to the source line SL, and the drain of the gating transistor is connected to the word line WL; and the word line WL, the bit line BL and the gate line GL are arranged in directions perpendicular to each other, and the source line SL and the bit line BL are arranged in directions parallel to each other. The bottom of each word line WL of the memory array is electrically connected to the drain of the gating transistor through at least one layer of connection holes, so that the memory array is isolated from the base of the gating transistor and connected in alignment.

Specifically, the word line WL arranged in the vertical direction (the Z-axis direction) is connected to a column of memory cells (or 1S1R cells), and the memory cells of each layer (the XY-axis plane direction) are accessed through the bit lines BL of the layer, and a gating transistor is arranged at the bottom of the corresponding word line WL, and the gating transistor is gated by applying a voltage through the gate line GL and the source line SL. Herein, the gate line GL connects the gates of a row of gating transistors along the Y-axis direction, and the source line SL connects the sources of the transistors along the X-axis direction. The three-dimensional memory array controls the state of the memory cell through the bit line BL and the word line WL, as well as the gate line GL and the source line SL of the gating transistor.

When operating the three-dimensional memory array, a corresponding operating voltage is applied between the bit line BL and the word line WL where the 1S1R cell is located, and the gating transistor at the bottom of the selected memory cell is turned on, while the gating transistors in the remaining columns are turned off. The voltage between the non-selected bit line BL and the word line WL is consistent, but the gating transistors at its bottom are turned off. Then, a voltage of ½ V biased read-write scheme is adopted, where a voltage of V is applied to the selected (addressed) memory cell and a voltage of ½ V is applied to the non-selected memory cell. The voltage requirements it meets are: Vdd>Vset>½ Vdd>Vread, where Vset represents the voltage that can cause the 1S1R cell to undergo HRS-LRS resistance switching, and the gating transistor maintains a high resistance off state when the voltage is about ½ Vdd, and the leakage current is suppressed at this time. Vg represents the voltage that turns on the gating transistor (Vg>Vth, Vth represents the threshold voltage of the gating transistor). It can be seen that the above operation method can be used to access any memory cell in the three-dimensional memory array. Accordingly, multiple bit lines BL or multiple source lines SL may be enabled at the same time to implement parallel access.

In a specific embodiment of the present disclosure, the memory adopts a 1S1R structure of Nb/$NbO_x$/$HfO_x$/TiN, and the state of the memory cell includes a write operation, an erase operation and a read operation. The states of each device under different operations are described separately below.

Herein, the write operation further includes: applying a voltage Vdd to the bit line BL plane where the selected memory cell is located, and applying a voltage ½ Vdd to the bit line BL plane where the non-selected memory cell is located; applying a voltage 0 to the word line WL where the selected memory cell is located, and applying a voltage ½ Vdd to the word line WL in the non-selected memory cell; applying a voltage Vg to the gate line GL where the selected memory cell is located, applying a 0 bias to the source line SL where the selected memory cell is located, and turning on the gating transistor in a column where the selected memory cell is located.

The erase operation further includes: applying a 0 bias to the bit line BL plane where the selected memory cell is located, and applying a voltage of ½ Vdd to the bit line BL plane where the non-selected memory cell is located; applying a voltage Vdd to the word line WL where the selected memory cell is located, and applying a voltage of ½ Vdd to the word line WL in the non-selected memory cell; applying a voltage Vg to the gate line GL where the selected memory cell is located, applying a 0 bias to the source line SL where the selected memory cell is located, and turning on the gating transistor in a column where the selected memory cell is located.

The read operation further includes: applying a voltage Vread to the bit line BL plane where the selected memory cell is located, setting the bit line BL and all word lines WL where the non-selected memory cells are located to 0; applying a voltage Vg to the gate line GL where the selected memory cell is located, applying a 0 bias to the source line SL where the selected memory cell is located, and turning on the gating transistor of the column where the selected memory cell is located.

In a specific embodiment of the present disclosure, the memory cell is a 1S1R structure combining an RRAM and a selector, wherein FIG. 4 shows a partial correspondence between the memory cell according to the present disclosure and the structure diagram. As can be seen from FIG. 4, the multi-layer gating layer 4 is connected to the resistive switching layer 6 at the corresponding position in the vertical direction to form a 1S1R memory cell, and the other end is connected to the horizontal bit line, and the word line is connected to the gating transistor of the logic part through the bottom connection hole.

In a specific embodiment of the present disclosure, the memory cell may include a RRAM and a selector connected in series (as shown in FIG. 4). In addition, the memory cell may also use a self-selection cell (SSC), or an RRAM and a selector connected in series through an embedded intermediate electrode.

Corresponding to the above three-dimensional memory array, the present disclosure also provides a method of preparing a three-dimensional memory array, which is prepared by a bit line oxidation method, a bit line filling method or a bit line corrosion method.

Specifically, FIGS. 5 to 10 respectively illustrate the schematic process flow of preparing the bit line oxidation method of the three-dimensional memory array according to the embodiment of the disclosure.

As shown in FIGS. 1 to 10, when the memory cell is a RRAM and a selector connected in series, the preparation process of the bit line oxidation method of the three-dimensional memory array of the embodiment of the present disclosure includes at least the following steps:

- S110: preparing alternately stacked isolation dielectric layers 2 and bit lines 3 on a preset front layer 1 including connection holes;
- S120: preparing vertical through holes 5 on the isolation dielectric layer 2 and the bit line 3 by etching, wherein the vertical through holes 5 penetrate the isolation dielectric layer 2 and the bit line 3 and extend to the front layer 1;
- S130: preparing a gating layer 4 by chemical reaction and corrosion treatment in sequence;
- S140: preparing a resistive switching layer 6 extending through the vertical through holes 5, wherein the resistive switching layer 6 and the gating layer 4 form a 1S1R memory cell;
- S150: disposing vertical word lines in the vertical through holes 5 to form the three-dimensional memory array.

As a specific example, FIGS. 5 to 10 illustrate a preparation process of a bit line oxidation method according to an embodiment of the present disclosure.

Figure 5:
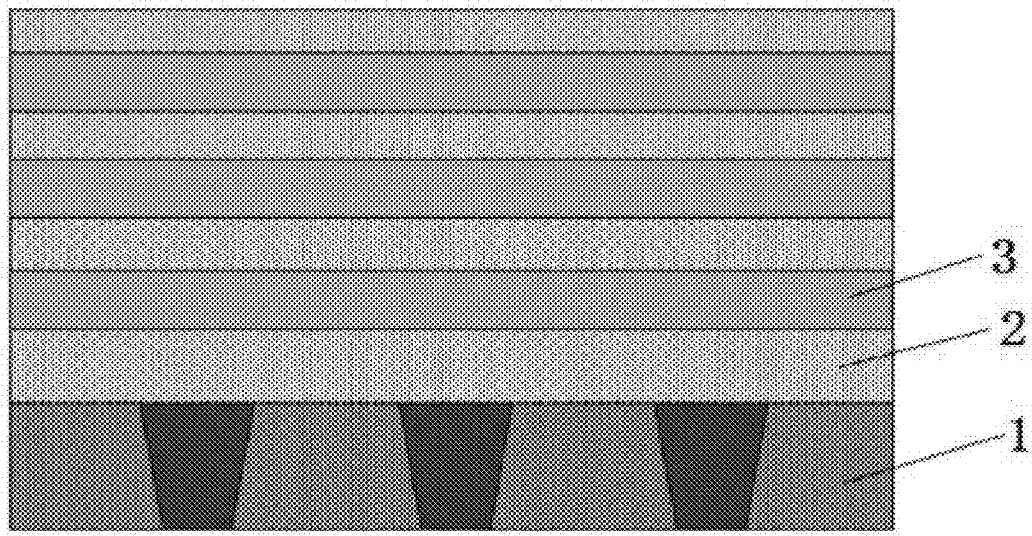
FIG. 5 is a first flow chart of a preparation of a bit line oxidation method according to an embodiment of the present disclosure.

As shown in FIG. 5, firstly, alternately stacked isolation dielectric layers 2 and bit lines 3 are prepared on the prepared front layer 1 (which may include metal), wherein the layer directly above the front layer 1 is the isolation dielectric layer 2, and then alternately stacked bit lines (layer) 3 and isolation dielectric layers 2 are sequentially disposed.

Figure 6:
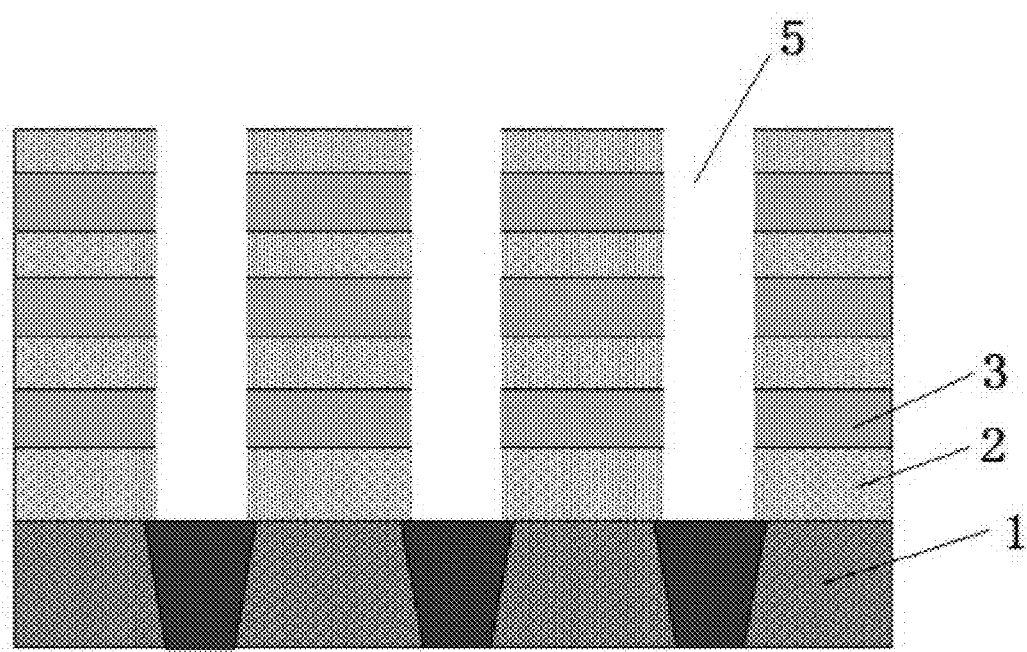
FIG. 6 is a second flow chart of a preparation of a bit line oxidation method according to an embodiment of the present disclosure.

As shown in FIG. 6, the alternately stacked isolation dielectric layer 2 and bit lines 3 are etched by photolithography to form vertical through holes 5, which penetrate the entire isolation dielectric layer 2 and bit lines 3 and extend to the front layer 1.

Figure 7:
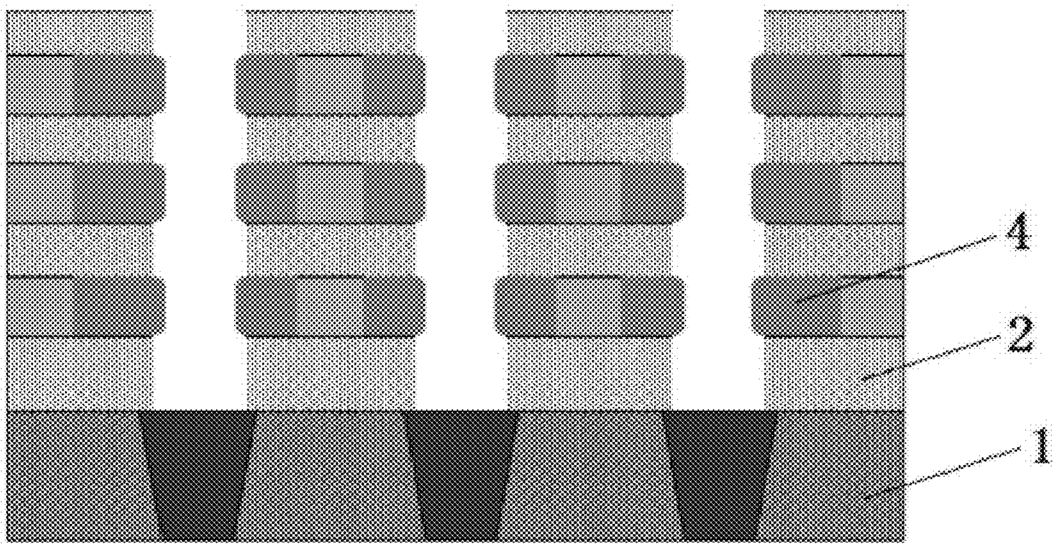
FIG. 7 is a third flow chart of a preparation of a bit line oxidation method according to an embodiment of the present disclosure.

As shown in FIG. 7, the gating layer 4 is prepared by using the chemical reaction product of the corresponding bit line 3 material, and the gating layer 4 and the bit lines 3 are located in the same layer.

Figure 8:
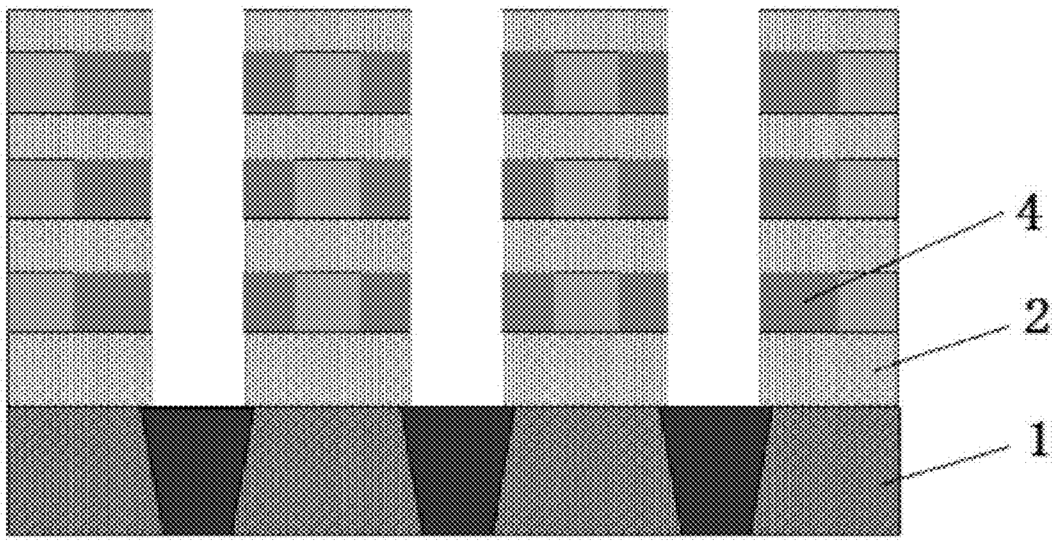
FIG. 8 is a fourth flow chart of a preparation of a bit line oxidation method according to an embodiment of the present disclosure.

As shown in FIG. 8, the redundant part of the gating layer 4 structure in the previous step is corroded away to form a regularly distributed gating layer 4 structure.

Figure 9:
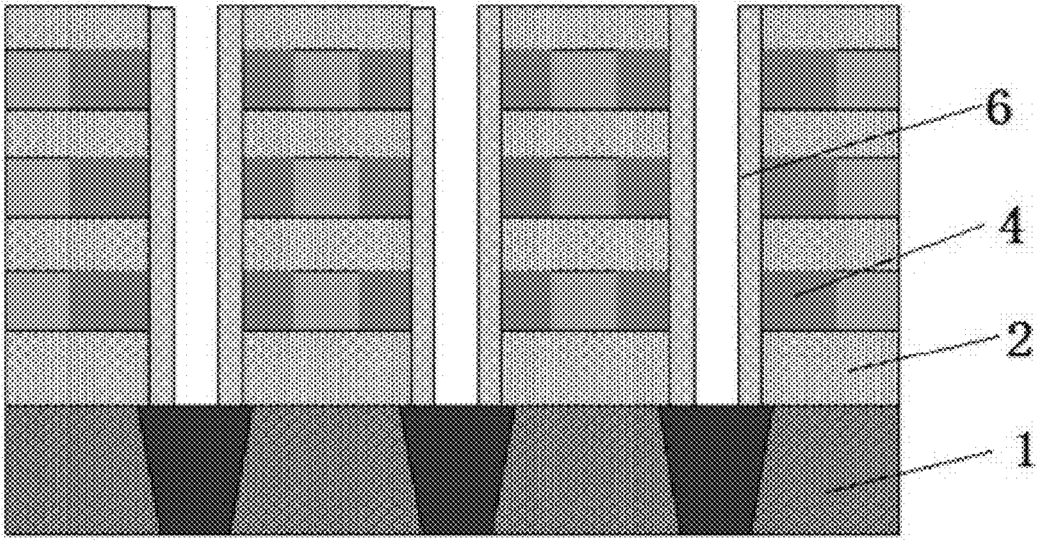
FIG. 9 is a fifth preparation flow chart of a preparation of a bit line oxidation method according to an embodiment of the present disclosure.

As shown in FIG. 9, a resistive switching layer 6 is prepared. The resistive switching layer 6 is vertically disposed in the vertical through holes 5 and connected to a column of the gating layer 4. A 1S1R memory cell connected in series is formed between the resistive switching layer 6 and the gating layer 4 at the corresponding position.

Figure 10:
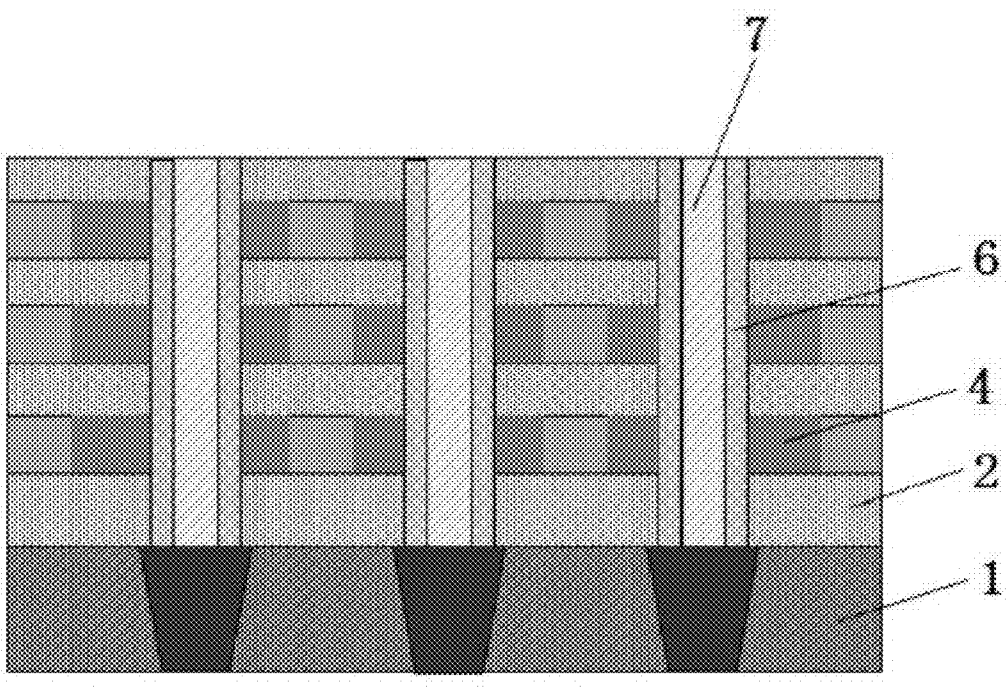
FIG. 10 is a sixth flow chart of a preparation of a bit line oxidation method according to an embodiment of the present disclosure.

As shown in FIG. 10, vertical word lines are disposed in the vertical through holes 5, and the vertical word lines are connected to the resistive switching layer 6 to form a three-dimensional memory array.

In a specific embodiment of the present disclosure, the preparation process of the bit line oxidation method of the three-dimensional memory array includes: alternately preparing a multi-layer silicon oxide $SiO_2$ and metal niobium Nb stack on a substrate, using plasma enhanced chemical vapor deposition PECVD and sputtering respectively, as shown in FIG. 5; using photolithography and reactive ion etching (RIE) to form deep holes, as shown in FIG. 6; oxidizing the metal Nb on the side wall of the deep holes to form a niobium oxide $NO_x$ gating layer, as shown in FIG. 7; using wet corrosion to remove the overgrown $NO_x$ layer and corrode its edge, as shown in FIG. 8; using ALD deposition to prepare $HfO_x$ resistive switching layer, as shown in FIG. 9; using plasma enhanced chemical vapor deposition TiN to prepare vertical word lines, as shown in FIG. 10.

Specifically, FIGS. 11 to 19 respectively illustrate schematic flow of a preparation process of a bit line 3 filling method of a three-dimensional memory array according to an embodiment of the disclosure.

As shown in FIGS. 11 to 19, when the memory cell is a RRAM and a selector connected in series, the preparation process of the bit line filling method of the three-dimensional memory array of the embodiment of the present disclosure includes at least the following steps:

S210: preparing alternately stacked isolation dielectric layer 2 and sacrificial dielectric layer 8 on a preset front layer 1;

Herein, the material of the sacrificial dielectric layer 8 includes $SiN_x$; and the preparation process of the sacrificial dielectric layer 8 includes oxidation, atomic layer deposition (ALD), or physical vapor deposition (PVD);

S220: preparing vertical through holes 5 on the isolation dielectric layer 2 and the sacrificial dielectric layer 8 by etching, wherein the vertical through holes 5 penetrate the isolation dielectric layer 2 and the sacrificial dielectric layer 8 and extend to the front layer 1;

S230: corroding the edge of the sacrificial dielectric layer 8 to form gating grooves 9, and preparing a gating layer 4 in the gating grooves 9;

S240: preparing a resistive switching layer 6 extending through the vertical through holes 5, wherein the resistive switching layer 6 and the gating layer 4 form a 1S1R memory cell;

S250: disposing vertical word lines in the vertical through holes 5;

S260: corroding the remaining sacrificial layer dielectric, and filling the metal bit lines 3 in the corroded sacrificial layer, to form the three-dimensional memory array.

As a specific example, FIGS. 11 to 19 illustrate a preparation process of a bit line oxidation method according to an embodiment of the present disclosure when the memory cell is an RRAM and a selector connected in series.

Figure 11:
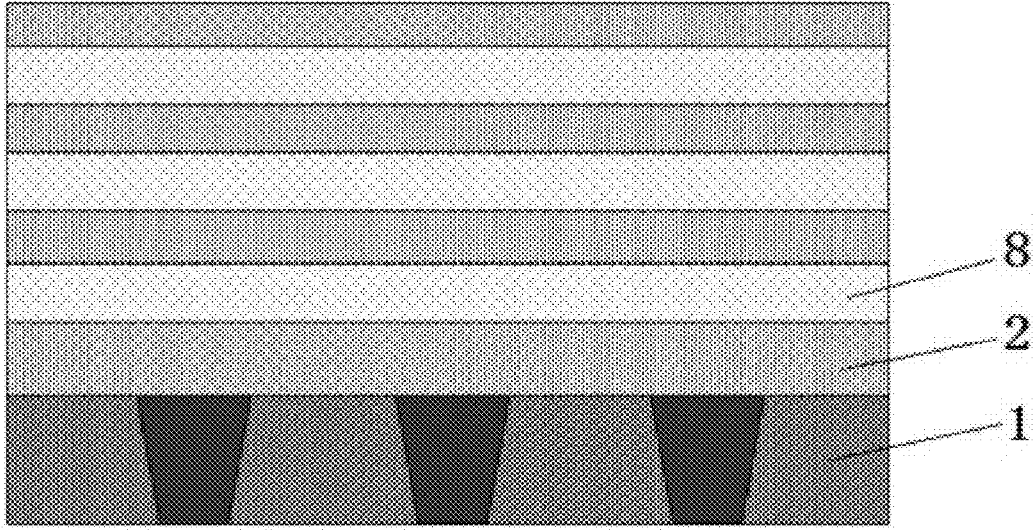
FIG. 11 is a first flow chart of a preparation of a bit line filling method according to an embodiment of the present disclosure.

As shown in FIG. 11, an isolation dielectric layer 2 and a sacrificial dielectric layer 8 alternately stacked are prepared on a front layer 1 including connection holes, wherein the isolation dielectric layer 2 is located above the front layer 1, and then the sacrificial dielectric layer 8 and the isolation dielectric layer are alternately deposited thereon.

Figure 12:
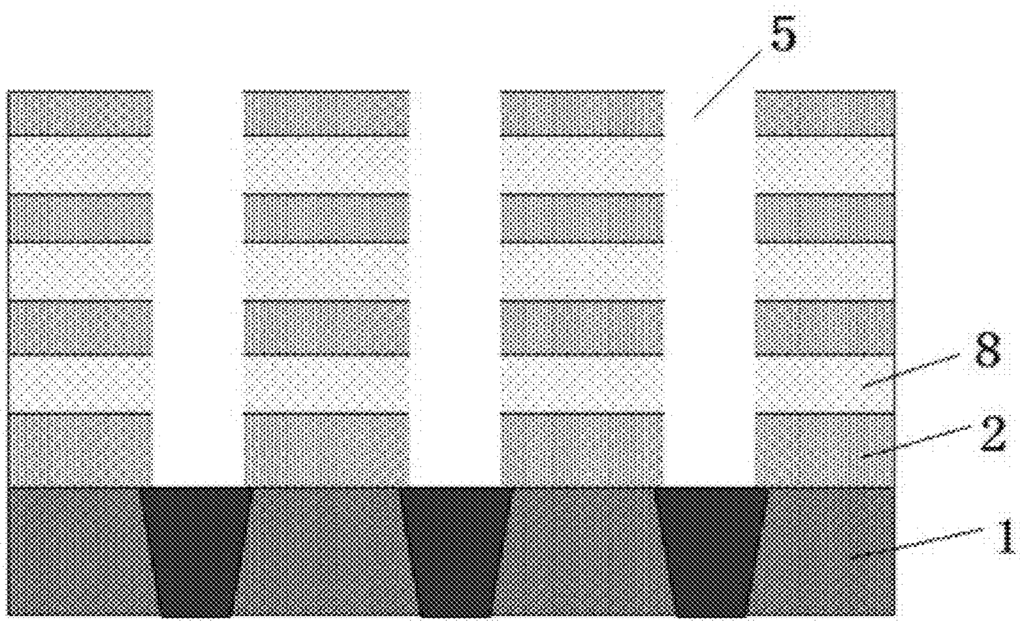
FIG. 12 is a second flow chart of a preparation of a bit line filling method according to an embodiment of the present disclosure.

As shown in FIG. 12, the alternately stacked isolation dielectric layer 2 and sacrificial dielectric layer 8 are etched by photolithography to form vertical through holes 5, which penetrate the entire isolation dielectric layer 2 and sacrificial dielectric layer 8 and extend to the front layer 1.

Figure 13:
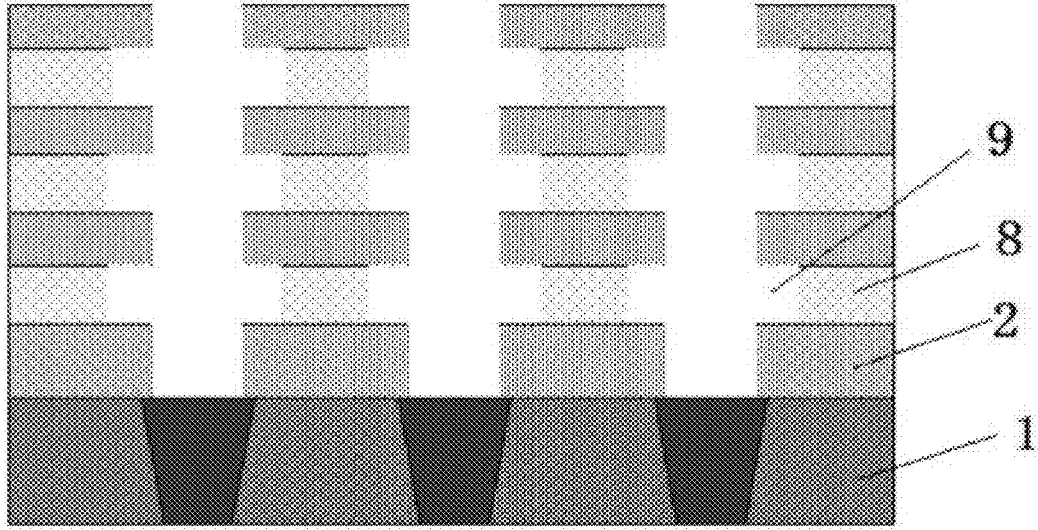
FIG. 13 is a third flow chart of a preparation of a bit line filling method according to an embodiment of the present disclosure.

As shown in FIG. 13, the edge of the sacrificial dielectric layer 8 is corroded to form grooves used for gating, which may also be referred to as gating grooves 9.

Figure 14:
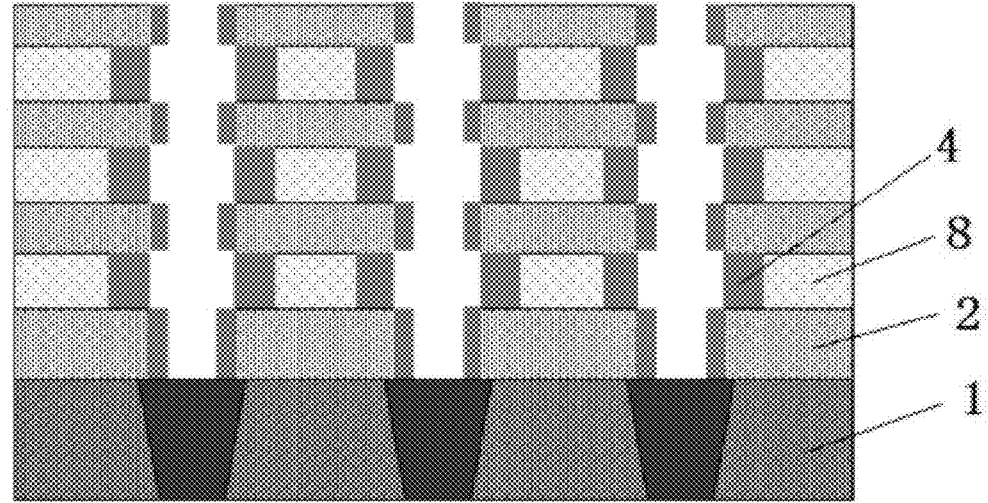
FIG. 14 is a fourth flow chart of a preparation of a bit line filling method according to an embodiment of the present disclosure.

As shown in FIG. 14, a gating layer 4 is prepared in the gating grooves 9.

Figure 15:
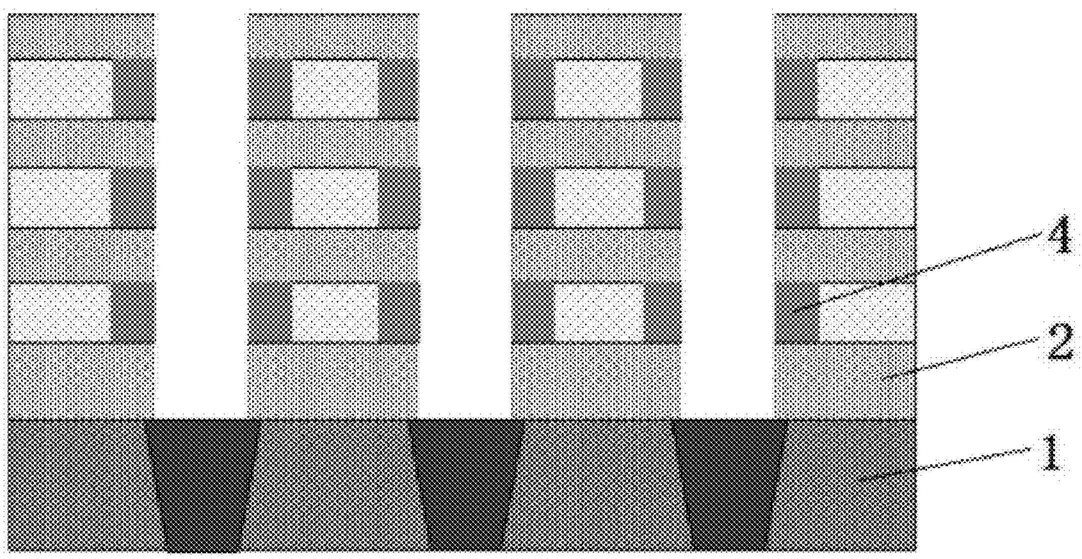
FIG. 15 is a fifth flow chart of a preparation of a bit line filling method according to an embodiment of the present disclosure.

As shown in FIG. 15, the gating layer 4 in the previous step is corroded to remove the redundant connection part of the intermediate electrode to form a regular gating layer 4.

Figure 16:
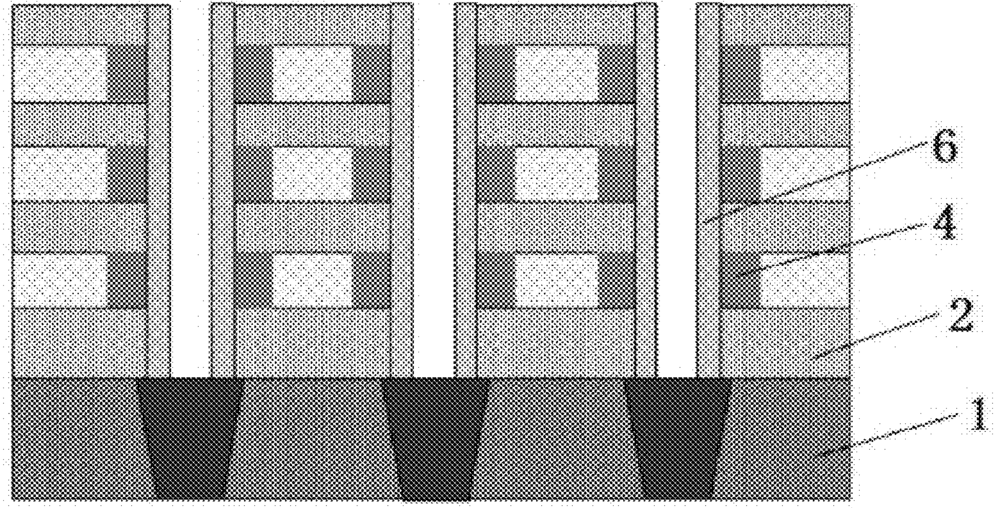
FIG. 16 is a sixth flow chart of a preparation of a bit line filling method according to an embodiment of the present disclosure.

As shown in FIG. 16, a resistive switching layer 6 is prepared. The resistive switching layer 6 is vertically disposed in the vertical through holes 5 and connected to a column of the gating layer 4. A 1S1R memory cell connected in series is formed between the resistive switching layer 6 and the gating layer 4 at the corresponding position.

Figure 17:
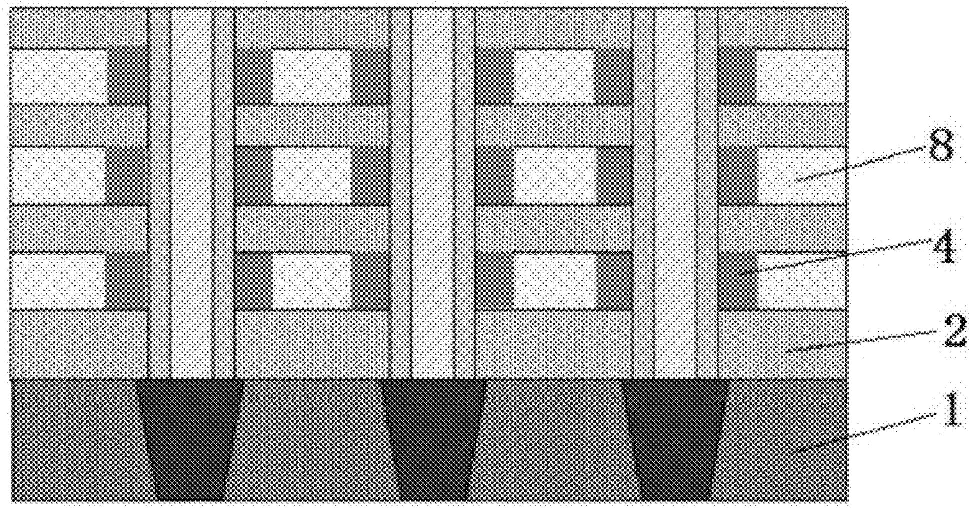
FIG. 17 is a seventh flowchart of a preparation of a bit line filling method according to an embodiment of the present disclosure.

As shown in FIG. 17, vertical electrodes are prepared, that is, vertical word lines are arranged in the vertical through the holes 5, and the vertical word lines are connected to the resistive switching layer 6.

Figure 18:
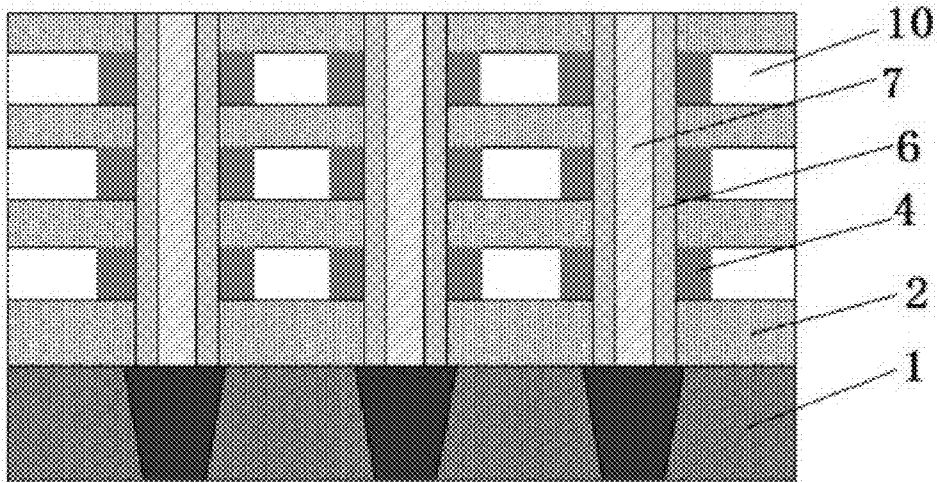
FIG. 18 is an eighth flowchart of a preparation of a bit line filling according to an embodiment of the present disclosure.

As shown in FIG. 18, the remaining sacrificial dielectric layer is corroded to form an avoidance space 10 to dispose the bit lines 3.

Figure 19:
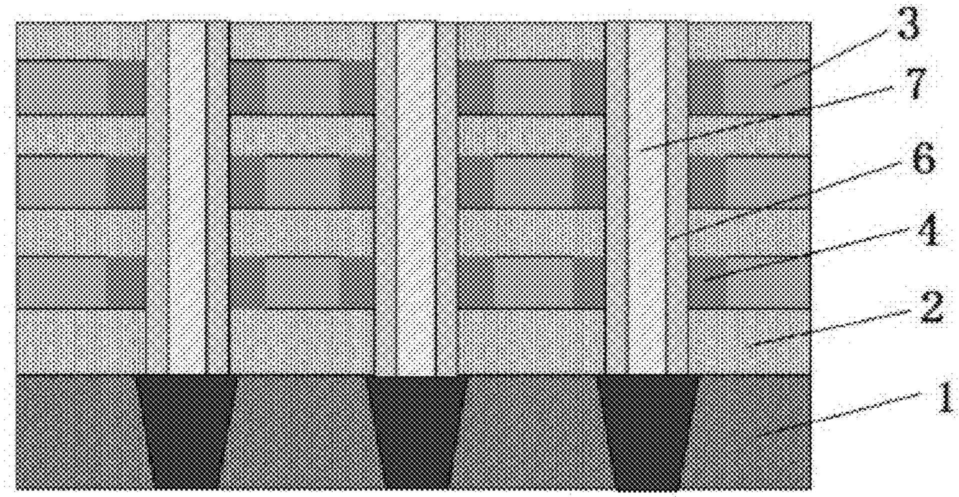
FIG. 19 is a ninth flowchart of a preparation of a bit line filling method according to an embodiment of the present disclosure.

As shown in FIG. 19, metal bit lines 3 are filled in the positions of the remaining sacrificial layer that have been corroded away to form a three-dimensional memory array.

In a specific embodiment of the present disclosure, the preparation process of the bit line filling method of the three-dimensional memory array includes: alternately preparing a multi-layer silicon oxide $SiO_2$ and silicon nitride $SiN_x$ stack on a substrate, using plasma enhanced chemical vapor deposition PECVD, as shown in FIG. 11; using photolithography and reactive ion etching (RIE) to form deep holes, as shown in FIG. 12; using phosphoric acid to selectively corrode the edge of the silicon nitride $SiN_x$ of the dielectric layer 2, as shown in FIG. 13; using ALD to prepare a $NbO_x$ gating layer, as shown in FIG. 14; using wet corrosion to remove the overgrown $NbO_x$ layer and corrode its edge, as shown in FIG. 15; using ALD to prepare a $HfO_x$ resistive switching layer, as shown in FIG. 16; using plasma enhanced chemical vapor deposition TiN vertical word line electrodes, as shown in FIG. 17; using phosphoric acid to corrode away the remaining sacrificial dielectric layer, as shown in FIG. 18; using ALD to fill the bit line metal Nb electrode to complete the storage array preparation, as shown in FIG. 19.

In another specific embodiment of the present disclosure, the material of the isolation dielectric layer 2 in the above two preparation schemes includes silicon oxide $SiO_2$ or carbon silicon oxyhydride (SiCOH); the preparation process of the isolation dielectric layer 2 includes chemical vapor deposition CVD or plasma enhanced chemical vapor deposition PECVD; the thickness of the isolation dielectric layer 2 ranges from 10 to 1000 nm.

As a specific example, in the above two preparation methods, the materials of the bit line 3 and the word line include one or more of metal vanadium V, metal niobium Nb, metal ruthenium Ru, metal tungsten W, metal tantalum Ta, tantalum nitride TaN, metal titanium Ti, titanium nitride TiN, titanium tungsten TiW, metal aluminum Al, aluminum oxide $AlO_x$, aluminum titanium nitride TiAlN or AlTiN, metal hafnium Hf, metal iridium Ir, metal manganese Mn, metal zinc Zn, metal platinum Pt, metal palladium Pd, metal copper Cu and mixtures thereof; polysilicon material is doped in the bit line 3 and the word line; the disposing process of the bit line 3 and the word line includes physical vapor deposition (PVD), plasma enhanced chemical vapor deposition or atomic layer deposition; the thickness of the bit line is in the range of 10 to 1000 nm. In the above two preparation methods, the material of the gating layer 4 includes one or more of niobium oxide ($NbO_x$), vanadium oxide ($VO_x$), and mixtures thereof; and the preparation process of the gating layer 4 includes: oxidation, atomic layer deposition (ALD), or physical vapor deposition (PVD); or doping the material, wherein the dopant includes one or more of Al, Cu, Au, and Ti, and the doping process includes ion implantation (IMP) and co-sputtering; the material of the resistive switching layer 6 includes one or more of tantalum, tantalum oxide $TaO_x$, titanium oxide $TiO_x$, hafnium oxide $HfO_x$, zirconium oxide $ZrO_x$, silicon oxide $SiO_x$, etc., and mixtures thereof; the preparation process of the resistive switching layer 6 includes oxidation or atomic layer deposition (ALD); the resistive switching layer 6 includes a dopant, wherein the dopant includes one or more of Al, Cu, Au, and Ti, etc.; the doping process includes ion implantation (IMP) and co-sputtering.

In the above steps, the front layer is preferably silicon oxide $SiO_2$ or a low permittivity material (Low-K dielectric), such as one or more of porous $SiO_2$, porous SiCOH, USG, BPSG and SiCN, or their combinations. The preferred preparation process is chemical vapor deposition CVD (APCVD, PECVD, LPCVD), etc.

It should be noted that in the above two preparation processes, the materials or preparation processes used for the same structural parts can be the same. For example, the connection hole material in the front layer 1 can be selected from Cu, W, Al, TaN, etc. The chemical composition representation with hyphens used in the present disclosure indicates a specific compound or the elements contained in the compound, and it is intended to represent all chemical quantities involving the indicated elements.

In a specific embodiment of the present disclosure, the memory cell may further include a self-selection cell (SSC) or an RRAM and a selector connected in series through an embedded intermediate electrode. The specific structures of the self-selection cell (SSC, self-selection type) and the RRAM and the selector connected in series through an embedded intermediate electrode (embedded electrode type) will be described hereinafter.

Figure 20:
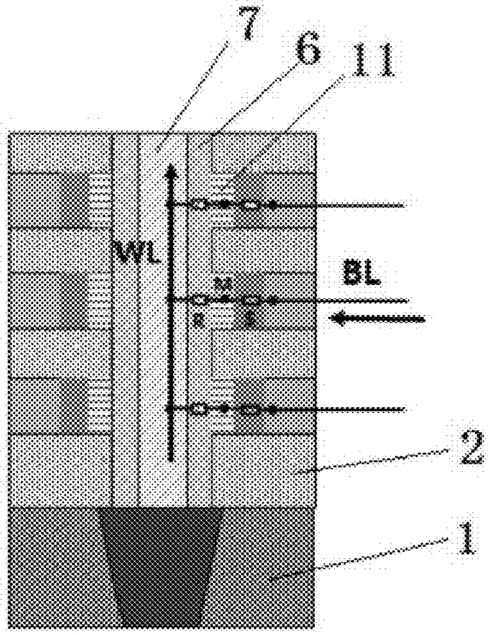
FIG. 20 is a schematic structural diagram of a memory cell embedded electrode type according to an embodiment of the present disclosure.

Specifically, FIG. 20 illustrates a schematic diagram of a memory cell structure according to an embodiment of the present disclosure, which is a RRAM and a selector connected in series through an embedded intermediate electrode.

As shown in FIG. 20, in this embodiment, an intermediate electrode M is provided between the RRAM (corresponding to the resistive switching layer 6) and the selector (corresponding to the gating layer 4) of the memory cell. The intermediate electrode M is used to physically isolate the resistive switching layer 6 and the gating layer 4, while ensuring electrical connection therebetween, thereby avoiding component interference between the materials of the RRAM and the selector, and ensuring the performance and stability of the memory cell.

The material of the intermediate electrode 11 includes one or more of metal vanadium V, metal niobium Nb, metal ruthenium Ru, metal tungsten W, metal tantalum Ta, tantalum nitride TaN, metal titanium Ti, titanium nitride TiN, titanium tungsten TiW, metal aluminum Al, aluminum oxide $AlO_x$, aluminum titanium nitride TiAlN or AlTiN, metal hafnium Hf, metal iridium Ir, metal manganese Mn, metal zinc Zn, metal platinum Pt, metal palladium Pd, metal copper Cu, and mixtures thereof, wherein the mixture includes a multilayer structure or a mixture of multilayer materials (the same below); or doped polysilicon material, preferably, prepared by physical vapor deposition (PVD), plasma enhanced chemical vapor deposition PECVD or atomic layer deposition (ALD).

It can be seen that in this embodiment, the intermediate electrode 11 can be used to electrically connect the gating layer 4 and the resistive switching layer 6 to form a 1S1R memory cell together. The intermediate electrode 11 can physically isolate the gating layer 4 and the resistive switching layer 6, so that there will be no diffusion of components between the materials, which is convenient for separately regulating the gating layer 4 and the resistive switching layer 6. In addition, the preparation method of the embedded electrode is adopted to embed the intermediate electrode 11 of the conventional 1S1R structure between the isolation dielectric, which solves the problem of short circuit when the conventional vertical integrated structure array is grown on the vertical sidewall, and intermediate electrode 11 is adopted in the 1S1R, and expands the range of applicable materials (not limited to self-selected functional materials).

Specifically, the preparation process for the three-dimensional memory array of this embodiment includes: 1) preparing an alternately stacked isolation dielectric layer 2 and bit lines 3 on a substrate; 2) photolithographically etching all the alternately stacked layers prepared in 1) to form vertical through holes 5; 3) preparing a selection layer 4 using a chemical reaction product of the bit line material; 4) corroding the edge of the bit lines to form grooves; 5) preparing intermediate electrodes 11 in the grooves; 6) etching a redundant connection part of the intermediate electrodes 11; 7) preparing a resistive switching layer 6 and connecting it to the selection layer 4 through the intermediate electrodes 11 to form a 1S1R structure; 8) preparing vertical electrodes to form a final three-dimensional memory array.

Figure 21:
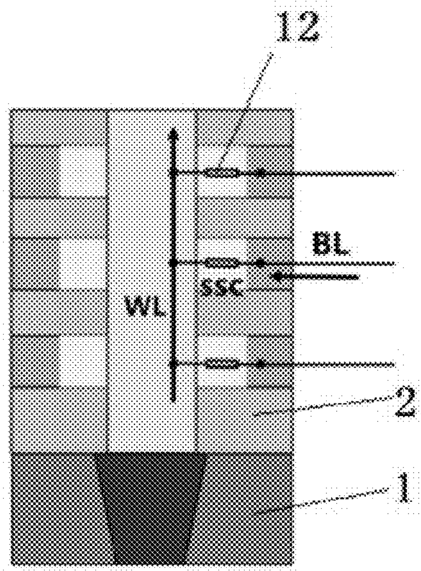
FIG. 21 is a schematic diagram of the structure of a self-selection memory cell according to an embodiment of the present disclosure.

As another example, FIG. 21 illustrates a schematic structure in which the memory cell structure according to an embodiment of the present disclosure is a self-selection cell (SSC).

As shown in FIG. 21, in this embodiment, the self-selection cell 12, which can also be understood as a self-selection layer, can realize the function of a conventional multi-layer 1S+1R memory cell through a single-layer thin film, has huge application potential, and can effectively simplify the preparation processes needed for forming a three-dimensional memory array and improve storage flexibility.

The material of self-selection cell may include one or more of niobium oxide $NbO_x$), vanadium oxide ($VO_x$), and mixtures thereof. The preparation process for the self-selection layer is preferably oxidation, atomic layer deposition (ALD), or physical vapor deposition (PVD). Or the material is doped, wherein the dopant is preferably one or more of Al, Cu, Au, and Ti, etc. The doping process is preferably ion implantation (IMP) and co-sputtering.

Specifically, the preparation processes for the three-dimensional memory array of this embodiment can adopt three steps: etching bit lines, oxidizing bit lines and filling bit lines (corresponding to bit line corrosion method, bit line oxidation method and bit line filling method respectively), wherein the bit line etching process includes 1) preparing alternately stacked isolation dielectric layer and bit lines on a substrate; 2) photolithographically etching all the alternately stacked layers prepared in 1) to form vertical through holes; 3) corroding away the bit line edges; 4) preparing an SSC self-selection layer; 5) corroding away the redundant parts of the selection layer structure to isolate the self-selection cell; and 6) preparing vertical word lines.

The bit line oxidation process includes: 1) preparing alternately stacked isolation dielectric layer and bit lines on a substrate; 2) photolithographically etching all the alternately stacked layers prepared in 1) to form vertical through holes; 3) preparing a self-selection layer using a chemical reaction product of the bit line material; 4) corroding away redundant parts in the selection layer structure to isolate the self-selection cell; and 5) preparing vertical word lines.

The bit line filling method includes: 1) preparing an isolation dielectric layer and a sacrificial dielectric layer stacked alternately on a substrate; 2) photolithographically etching all the alternately stacked layers prepared in 1) to form vertical through holes; 3) corroding the edge of the sacrificial dielectric layer to form grooves; 4) preparing a self-selection layer in the grooves; 5) corroding the redundant connection parts of the intermediate electrodes; 6) preparing vertical electrodes; and 7) corroding the sacrificial dielectric layer; 8) filling the metal bit lines.

The specific processes of the above three preparation processes can refer to the description in the preparation process embodiments of other types of memory cells above, and the above embodiments of the structures of the three different memory cells, their preparation processes and selected materials can be referenced to each other and will not be repeated here.

According to the scheme of the three-dimensional memory array and preparation method of the present disclosure, the nonlinear requirements of 1S1R for the gating transistor can be greatly reduced, and the storage capacity of the array can be improved; compared with the conventional 1T1R, the area overhead can be reduced and the array density can be improved. In addition, the three-dimensional 1TnSnR provided by the present disclosure can be fully compatible with CMOS logic process through RRAM stacking, and can be used as an embedded memory (>0.05 $Gb/mm^2$) or an independent memory, and can have a cost advantage in process as the number of stacking layers increases.

The three-dimensional memory array and the preparation method according to the present disclosure are described by way of example with reference to the drawings. However, it should be understood by those skilled in the art that various improvements can be made to the three-dimensional memory array and the manufacturing method proposed by the present disclosure without departing from the content of the present disclosure. Therefore, the protection scope of the present disclosure should be determined by the content of the attached claims.

What is claimed is:

1. A three-dimensional memory array, comprising memory cells arranged in an array, wherein in each memory cell:

one end of the memory cell is connected to a word line WL, and the other end thereof is connected to a bit line BL, and a corresponding gating transistor is provided at a bottom of each word line WL, and the bottom of the word line WL is connected to a drain of the gating transistor;

a gate of the gating transistor is connected to a gate line GL, and a source of the gating transistor is connected to a source line SL; and the bit line BL, the word line WL, the source line SL, and the gate line GL control a state of the memory cell; and the word line WL, the bit line BL, and the gate line GL are arranged in directions perpendicular to each other, and the source line SL and the bit line BL are arranged in directions parallel to each other; and wherein the bottom of each word line WL of the three-dimensional memory array is electrically connected to the drain of the gating transistor through at least one layer of connection holes, so that the three-dimensional memory array is isolated from the gating transistor and connected in alignment, wherein the word line WL arranged in a Z-axis direction is connected to a column of memory cells, and in a XY-axis plane direction, the memory cells of each layer are accessed through the bit lines BL of the layer, and the gating transistor is gated by applying a voltage through the gate line GL and the source line SL, wherein the gate line GL connects the gates of a row of gating transistors along a Y-axis direction, and the source line SL connects the sources of the gating transistors along a X-axis direction.

2. The three-dimensional memory array of claim 1, wherein:

the memory cell comprises a RRAM and a selector connected in series, a self-selection cell (SSC), or a RRAM and a selector connected in series through an embedded intermediate electrode.

3. A method of preparing a three-dimensional memory array, comprising:

preparing the three-dimensional memory array of claim 1 by a bit line oxidation method or a bit line filling method.

4. The method of preparing the three-dimensional memory array of claim 3, wherein when the memory cell is a RRAM and a selector connected in series, the bit line oxidation method comprises:

preparing alternately stacked isolation dielectric layers and bit lines on a preset front layer;

preparing vertical through holes on the isolation dielectric layer and the bit lines by etching, wherein the vertical through holes penetrate the isolation dielectric layer and the bit lines and extend to the front layer;

preparing gating layer by chemical reaction and corrosion treatment in sequence;

preparing a resistive switching layer extending through the vertical through holes, wherein the resistive switching layer and the gating layer form a 1S1R memory cell;

disposing vertical word lines within the vertical through holes, to form the three-dimensional memory array.

5. The method of preparing the three-dimensional memory array of claim 3, wherein when the memory cell is a RRAM and a selector connected in series, the bit line filling method comprises:

preparing an isolation dielectric layer and a sacrificial dielectric layer stacked alternately on a preset front layer;

preparing vertical through holes on the isolation dielectric layer and the sacrificial dielectric layer by etching, wherein the vertical through holes penetrate the isolation dielectric layer and the sacrificial dielectric layer and extend to the front layer;

corroding an edge of the sacrificial dielectric layer to form a gating groove, and preparing a gating layer in the gating groove;

preparing a resistive switching layer extending through the vertical through holes, wherein the resistive switching layer and the gating layer form a 1S1R memory cell;

disposing vertical word lines in the vertical through holes;

corroding remaining sacrificial layer dielectric, and filling metal bit lines in the corroded sacrificial layer to form the three-dimensional memory array.

6. The method of preparing the three-dimensional memory array of claim 4, wherein:

a material of the isolation dielectric layer comprises silicon oxide $SiO_2$ or carbon silicon oxyhydride (SiCOH);

preparation process for the isolation dielectric layer comprises chemical vapor deposition (CVD) or plasma enhanced chemical vapor deposition (PECVD);

a thickness of the isolation dielectric layer is in a range of 10 to 1000 nm.

7. The method of preparing the three-dimensional memory array of claim 4, wherein:

materials of the bit line and the word line comprise one or more selected from a group consisting of metal vanadium V, metal niobium Nb, metal ruthenium Ru, metal tungsten W, metal tantalum Ta, tantalum nitride TaN, metal titanium Ti, titanium nitride TiN, titanium tungsten TiW, metal aluminum Al, aluminum oxide $AlO_x$, aluminum titanium nitride TiAlN or AlTiN, metal hafnium Hf, metal iridium Ir, metal manganese Mn, metal zinc Zn, metal platinum Pt, metal palladium Pd, and metal copper Cu;

the materials of the bit lines and the word lines are doped with polysilicon material;

preparation process for the bit lines and the word lines comprises physical vapor deposition (PVD), plasma enhanced chemical vapor deposition or atomic layer deposition; and a thickness of the bit lines is in a range of 10 to 1000 nm.

8. The method of preparing the three-dimensional memory array of claim 4, wherein a material of the gating layer comprises one or more selected from a group consisting of niobium oxide ($NbO_x$) and vanadium oxide ($VO_x$);

preparation process for the gating layer comprises: oxidation, atomic layer deposition (ALD), or physical vapor deposition (PVD); or doping the material, wherein the dopant comprises one or more selected from a group consisting of Al, Cu, Au, and Ti, and the doping process comprises ion implantation (IMP) and co-sputtering;

a material of the resistive switching layer comprises one or more selected from a group consisting of tantalum, tantalum oxide $TaO_x$, titanium oxide $TiO_x$, hafnium oxide $HfO_x$, zirconium oxide $ZrO_x$, and silicon oxide $SiO_x$;

preparation process for the resistive switching layer comprises oxidation or atomic layer deposition (ALD); and the resistive switching layer comprises a dopant, wherein the dopant comprises one or more selected from a group consisting of Al, Cu, Au, and Ti, and the doping process comprises ion implantation (IMP) and co-sputtering.

9. The method of preparing the three-dimensional memory array of claim 5, wherein a material of the sacrificial dielectric layer comprises $SiN_x$; and preparation process for the sacrificial dielectric layer comprises oxidation, atomic layer deposition (ALD), or physical vapor deposition (PVD).

* * * * *